United States Patent [19]

London

[11] 4,065,736
[45] Dec. 27, 1977

[54] AMPLITUDE AND PHASE PROGRAMMABLE ACOUSTIC SURFACE WAVE MATCHED FILTER

[75] Inventor: Arnold London, Tempe, Ariz.

[73] Assignee: Motorola, Inc., Schaumburg, Ill.

[21] Appl. No.: 690,490

[22] Filed: May 27, 1976

[51] Int. Cl.$^2$ .................. H03H 9/26; H03H 9/30; H01L 29/84; H01L 27/10
[52] U.S. Cl. ........................ 333/72; 307/304; 310/313; 310/366; 333/30 R; 333/70 T; 357/26; 357/41
[58] Field of Search ............. 357/41, 26; 333/30 R, 333/72, 71, 70 T; 310/8.1, 8.2, 9.8; 235/181; 340/146.2; 307/221 R, 221 C, 221 D, 304

[56] References Cited
U.S. PATENT DOCUMENTS

| | | | |
|---|---|---|---|
| 3,809,923 | 5/1974 | Esser | 333/70 T X |
| 4,005,318 | 1/1977 | Claiborne, Jr. | 307/304 |

OTHER PUBLICATIONS

Grant, et al.—"Conference 1973 International Electron Devices Meeting Technical Digest, Washington, D.C., Dec. 1973," Title page, pp. 236-239.
Ph. Defranould—"MOSFET Surface Wave Detectors for High Frequency Signal Processing," 1973, European Microwave Conference, vol. II, Brussels, Belgium, Sept. 1973, 4 pages.
Claiborne et al.-"MOSFET Ultrasonic Surface Wave Detectors for Programmable Matched Filters," APL vol. 19, No. 3, Aug. 1, 1971, pp. 58–60.

Primary Examiner—Alfred E. Smith
Assistant Examiner—Marvin Nussbaum
Attorney, Agent, or Firm—Michael D. Bingham

[57] ABSTRACT

A monolithic, amplitude and phase programmable matched filter device capable of generating and detecting biphase coded, pseudo random waveforms. Surface wave and metal oxide semiconductor (MOS) technologies are combined to develop an integrated filter structure having either a read only memory (ROM) or a digital shift register controlled thirty one-bit-silicon-MOSFET biphase tap structure. The use of silicon MOSFETs are piezoresistive surface wave detectors and the ROM structure provide the capability for generating and correlating 31-bit pseudo random (PN) sequences at a carrier frequency of 100 megaHertz. A 62 stage bucket brigade device array is utilized for controlling the amplitudes of the contiguous signal generation by random selection of codes from the 6×31 bit are at ROM.

9 Claims, 10 Drawing Figures

AMPLITUDE AND PHASE PROGRAMMABLE ACOUSTIC SURFACE WAVE MATCHED FILTER

BACKGROUND OF THE INVENTION

There is an increasing need for acoustic components to be used in microwave communications and radar systems which acquire and process large amounts of signal data. These acoustic components require a wide bandwidth capability, a large storage delay time and a built in filter or coding function. A substantial number of current requirements for signal processing systems can be met by using tapped surface acoustic wave devices. Such devices can simplify processing circuitry and represent a reliable, low cost alternative to present electronic techniques.

Surface wave devices can be used to perform matched filter functions in communications and radar systems where it is desirable to ambiguously transmit data in the presence of noise and/or jamming signals. Fixed coded devices are now in common usage where a series of phase interdigital metallic electrodes are implemented on a piezoelectric substrate for pseudo random (PN) coding and decoding. Electronic switching and logic functions in lumped circuit and hybrid form have been incorporated with the fixed coded devices to develop fixed programmable surface wave encoders and decoders. While integrated circuits can be used in such hybrid configurations, the separate manufacture and interconnection of acoustic and electronic devices creates cost inefficiencies and reliability problems due to circuit complexity. Because the development trend in signal processing subsystems is toward a higher degree of component integration in a miniaturized form factor and ultimately requires production of substantial quantites, monolithic building blocks combining the acoustic encoding and decoding functions with electronic functions such as switching, mixing and amplification on a single substrate should lead to considerable cost savings, improved reliability and size reduction.

One approach which might be pursued and which is disclosed in this application is the use of a silicon substrate with sputtered zinc oxide for surface wave generation and silicon MOSFET structures for detection and switching.

The use of a single crystal silicon substrate with MOSFET detector geometry utilizing piezoresistive surface wave detectors and a piezoelectric film transducer offers several advantages. Silicon is a low acoustic loss material and mainstay of the semiconductor microelectronics industry. The feasibility of efficiently launching surface wave using piezoelectric film transducers on silicon has been demonstrated in the art. Moreover, silicon MOSFET device technology permits the development of the required high yield, large scale integrated detectors. Further, it is possible to have programmable phase codes stored on the same silicon chip, in a read only memory circuit, which are selected therefrom by input logic. It is also possible to introduce any desired phase code by other suitable means such as a digital shift register. By using monolithic integrated circuit fabrication, a bucket brigade or other type of charge transfer device may be used to input the phase control circuit to have both phase and amplitude programmablity functions. A device of this type would be extremely useful in line-of-sight microwave communication channels where propagation effects introduce amplitude as well as phase distortions to a PN modulated signal. By having amplitude and phase control, channel distortions could be minimized to enhance signal to noise ratio.

SUMMARY OF THE INVENTION

Accordingly, it is an object of the present invention to provide a monolithic electronically programmable acoustic surface wave matched filter.

It is another object of the present invention to provide a phase programmable acoustic surface wave matched filter.

Further, it is an object of the present invention to provide an amplitude and phase programmable, monolithic acoustic surface wave matched filter.

In accordance with the foregoing objects, there is provided a monolithic amplitude and phase programmable matched filter suitable for encoding and correlating N-bit pseudo random sequences at a predetermined carrier frequency. The filter structure is monolithically fabricated using a semiconductor substrate material, such as silicon. A zinc-oxide transducer is disposed on the substrate for exciting surface waves in response to applied electrical signals at the carrier frequency. N-pairs of piezoresistive detectors are controlled by a bias circuit, each pair being rendered either conductive or nonconductive respectively, by a bias signal from the bias circuit in a predetermined manner. Moreover, logic circuitry is coupled to the bias circuit which varies the amplitude of the respective bias signals therefrom whereby the phase and the amplitude of the output signals produced, in timed sequence to the traveling surface wave, are varied. Hence, the structure is suitable for encoding and/or decoding phase and amplitude programmed signals for applications to advanced spread spectrum communication systems.

DETAILED DESCRIPTION OF THE PREFERRED EMBODIMENTS

Figure 1:
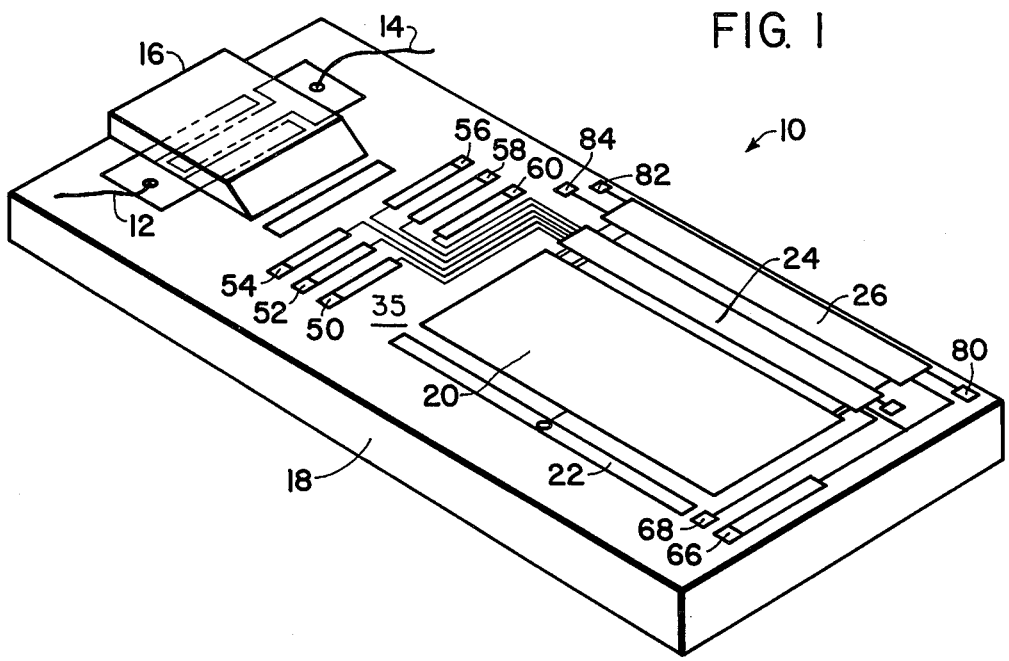
FIG. 1 is a perspective view of one embodiment of the matched filter of the present invention.

A perspective view of amplitude and phase programmable acoustic surface wave matched filter 10 of the present invention is shown in FIG. 1. Filter 10 is suitable for generating and detecting biphase coded, pseudo noise (PN) waveforms. In addition, the device of the present invention is suitable for amplitude weighting the PN waveforms.

The phase programmability features of filter 10 have been discussed in a paper written by A. London et al entitled "An Integrated Surface Wave Device Using Silicon MOSFETs And ZnO Film Transducers" presented at the International Electron Device Meeting (IEDM) and published in the 1975 IEDM Technical Digest, pages 620-623. Hence, only a brief discussion of the programmability feature 10 of the present invention is presented hereinafter.

Filter 10 is illustrated as having input terminals 12 and 14 to which an electrical input signal having a predetermined carrier frequency is applied thereacross to transducer 16. Transducer 16 may be a zinc oxide (ZNO) film layer piezoelectric transducer having an interdigitated metal pattern deposited on a silicon dioxide layer which itself is formed on semiconductor substrate 18. Substrate 18, as is understood, may be of a single crystal silicon material. Transducer 16 is utilized to excite acoustic traveling waves along the surface of substrate 18 in response to the applied carrier signal.

The traveling wave is detected and processed by a plurality (N) of MOSFET devices or piezoresistive detectors comprising detector array 20. The MOSFET detectors are fabricated using known monolithic MOS technology and may be, for example, P-channel devices. The acoustic wave is processed by each Nth or individual detector cell to provide an output signal. The phenomenon of generating an electrical signal in response to the acoustic wave is known in the art. For instance, as the acoustic wave passes through the channel region of a conductive MOSFET detector device, the minority carrier mobility varies with the stress created by the acoustic wave. Hence, AC current modulation of the drain current occurs and is detected. The drain to each one of the individual MOSFET detectors are coupled to common output line 22.

In one embodiment, phase and amplitude programmability is provided by read only memory (ROM) structure 24 and bucket brigade device structure 26, respectively, which are integrated into substrate 18 as is understood.

Figure 2:
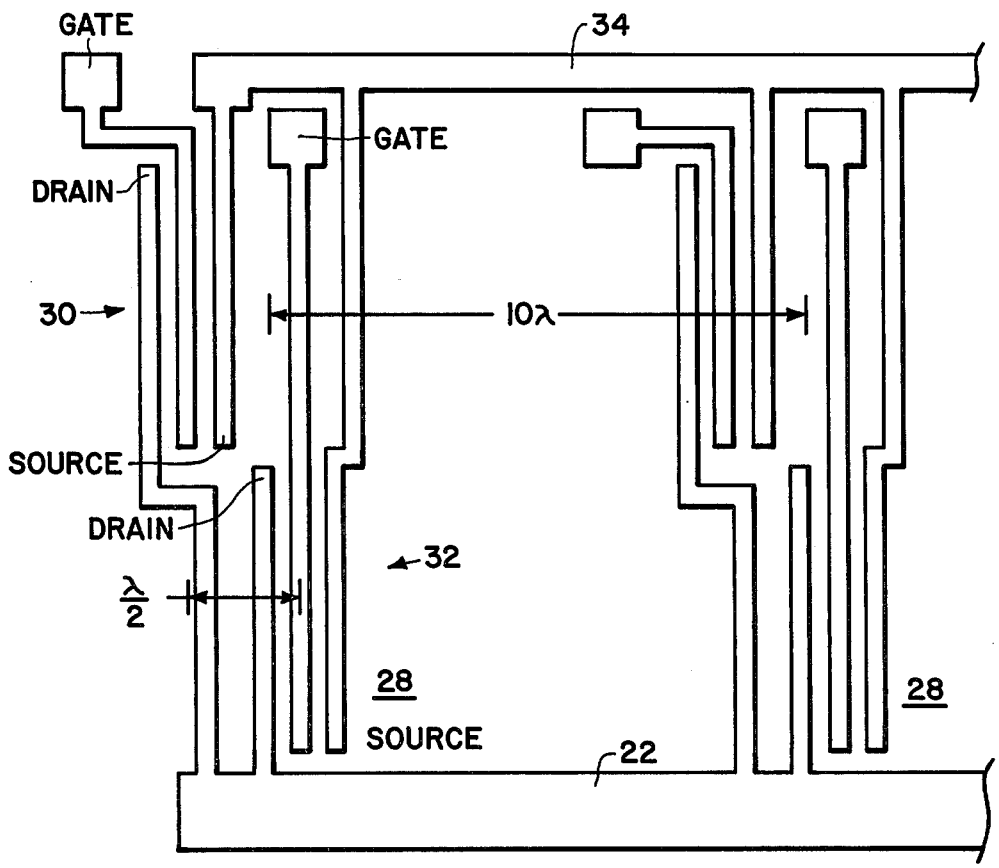
FIG. 2 is a diagram of the placement of the MOSFET detectors of the filter device of the embodiment of the invention.

In a device built and tested, detector array 20 contained 31 individual piezoresistive detector cells 28 spaced in increments of 10 $\lambda$ (at the operating frequency), as illustrated in FIG. 2. It is understood that any number of cells can be chosen to meet any particular criteria. Each individual detector cell 28 comprises two MOSFET detectors 30 and 32, with gate regions spaced $\lambda/2$ part, in the direction of the acoustic wave propagation. The source electrodes of both detectors are connected to common ground terminal 34 with the drain electrode coupled to output line 22. The gates of detectors 30 and 32 are coupled to respective outputs from ROM array 24. ROM array 24 provides for generating a coded biasing output signal to render either one of the detectors conductive according to a predetermined code. ROM 24, is adapted to receive a code select voltage at selected ones of input select terminals 35 such that, as shown, six different codes may be selected.

Figure 3:
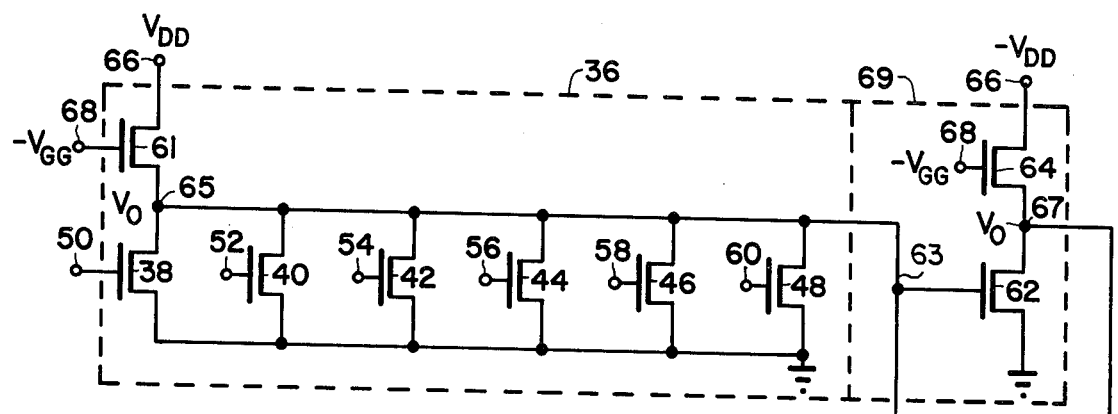
FIG. 3 is a schematic diagram of one cell of the ROM circuit of one embodiment of the invention and one pair of detectors of the filter device.

Referring to FIG. 3, individual ROM cell 36 of ROM array 24, which drives a respective detector cell 28 is illustrated. ROM cell 36 comprises six parallel connected MOSFET driver devices (38-48). The gate electrode of each driver device is adapted to be connected to respective code select terminals (50-60). A load MOSFET device 61 resistively connects to the voltage supply $V_{DD}$, at terminal 66 any one of the driver devices (38-48) which may be rendered conductive at any one time by a coded voltage being applied at respective code select terminals. The output from ROM cell 36 is coupled (via 63) directly to the gate electrode of detector device 32 and to the input of driver device 62 (which is biased by load device 64) of MOSFET inverter 69. Hence, a complementary output signal appears on the gate of detector 30 through inverter 69.

Code select terminals 50-60 are coupled to each ROM cell 36 of ROM array 24 and are normally maintained at ground potential except for the one corresponding to the desired code, which is brought to activating voltage which in the preferred embodiment is approximately $-5$ to $-10$ volts. Concurrently, load devices 61 and 64 are biased at a predetermined drain ($V_{DD}$) and gate ($V_{GG}$) voltage from respective bias terminals 66 and 68. A particular code is programmed into each individual ROM cell 36 by leaving either a thin gate oxide or a thick gate oxide under the gate metal of each driver device (38-48). Therefore, the threshold voltage of a particular driver device can be made greater or less than the activating voltage. For example, if in a particular ROM cell 36, only device 46 has a thin gate oxide, the other devices being thick oxide devices, in response to the activating voltage applied to terminal 58, this device will be activated. However, if in another ROM cell, the driver device corresponding to device 46 is a thick field device, it will not be activated by the voltage coupled to the gate thereof from terminal 58. Thus, the former driver device would cause associated detector device 32 to be rendered nonconductive while causing device 30 to be rendered conductive through inverter 62. However, the latter driver device would cause associated detector device 30 to be rendered nonconductive and to bias 32 conductive. All activated detector devices have the ROM supply voltage, $V_{DD}$, applied to their gates. Hence, by activating either detector device 30 or 32, the phase of the output voltage from detector cell 28, which is coupled to drain output terminal 22, may be shifted by 180°.

Figure 4:
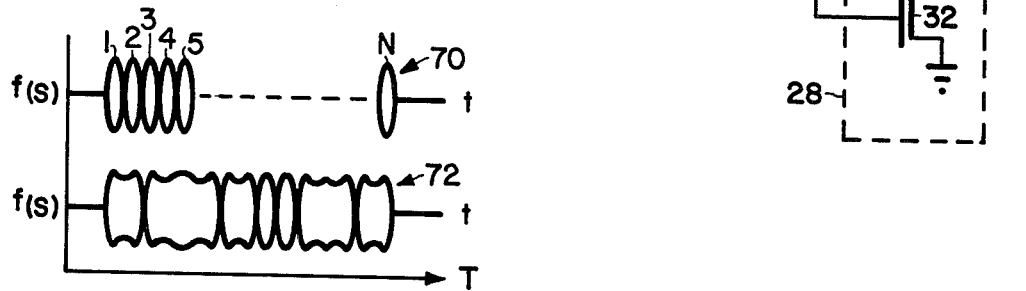
FIG. 4 shows output waveforms for identical and non-identical coding of ROM circuitry.

As illustrated in FIG. 4, if each individual ROM cell 36 is coded identically, either detector device 30 or 32 of each detector cell is rendered conductive by the activating voltage applied to the code select terminals. If this were the case, as the travelling wave passes through the particular activated detector device, an output signal is produced at the tapped output thereof as illustrated by waveform 70. Hence, if N-bits or detector cells are utilized, N output signals are derived at terminal 22 in timed relationship to one another. However, by coding each ROM cell in a nonidentical manner, the outputs of filter 10 (waveform 72) may be biphase coded to provide a pseudo random waveform pattern (waveform 72).

Although filter 10 has been illustrated as being limited to six predetermined codes by the 6×31 bit ROM structure 24, it is to be understood that more or less codes could be programmed by altering the number of driver devices from each individual ROM cell 36. Moreover, more or less bits may be derived by varying the number of detector device cells and associated ROM cells.

The usefulness of matched filter 10 can be enhanced by providing amplitude programmability at each tap in addition to the aforedescribed phase programmability. Such a filter would be applicable to analog adaptive signal processors for channel smoothing or averaging functions in spread spectrum receivers.

Figure 5:
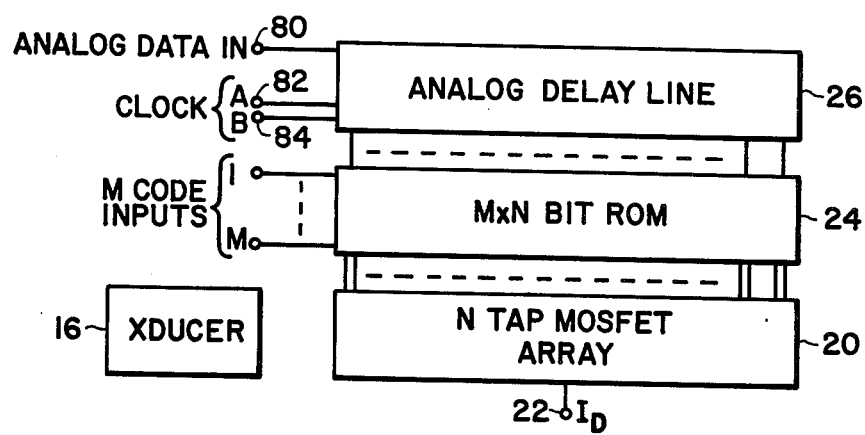
FIG. 5 is a block diagram of the matched filter including an amplitude control circuit.

Referring to FIG. 5 there is illustrated in block diagram form, filter 10, modified to provide both amplitude and phase programmability. Analog delay line 26, which may be integrated into substrate 18, is utilized to drive ROM structure 24 for varying the amplitudes of the output signals appearing at the tapped outputs to common output line 22 from detector array 20. By varying the magnitudes of gate voltage ($V_{GG}$) to load devices 61 and 64 (FIG. 3) the magnitude of the output signals appearing at tap 22 of the output of detector 28 may be varied to provide amplitude programmability. Briefly, as is understood, if the magnitude of $V_{GG}$ is made less than the magnitude of power supply voltage, $V_{DD} + V_T$ ($V_T$ = the threshold voltage of the MOSFET load device), the voltage, $V_O$, appearing at the outputs of load devices 61 and 64 (terminals 65 and 67, respectively) is approximately:

$$V_O \simeq V_{DD} - V_T \qquad (1)$$

Thus, by varying the gate bias voltage, the voltage applied to the gates of devices 30 and 32 is also varied which in turn varies the magnitude of the output signal appearing at output 22 of respective tapped detector device cells.

In operation, a desired pattern of DC voltages, which correspond to a desired amplitude code, may be clocked into analog delay line 26, at input terminal 80, at a very rapid rate by complementary clocking signals A and B applied to terminals 82 and 84. The DC input voltage pattern corresponds to a desired gate voltage which is to be applied to the respective load devices of an appropriate ROM cell. When all of the desired voltages have been propagated to the appropriate stages, oscillation of the clocking signals is terminated leaving fixed values of voltages applied to clock terminals 82 and 84 and a desired pattern of voltages ($V_{GG}$) applied to respective load devices of each ROM cell 36. The acoustic wave is then excited and propagates through the matched filter array with the waveforms appearing at respective tapped outputs to common output line 22 being both amplitude and phase weighted in accordance to a predetermined code.

Figure 6:
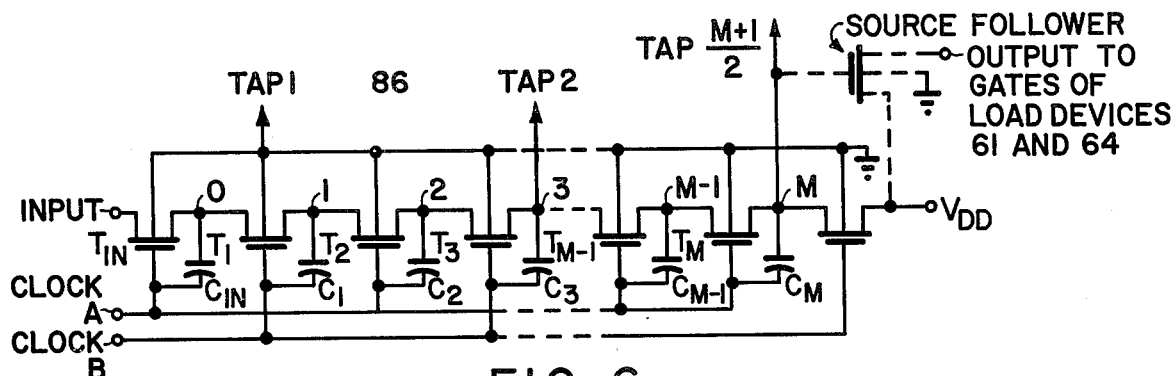
FIG. 6 is a schematic diagram of the amplitude control circuit of one embodiment of the invention.
Figure 7:
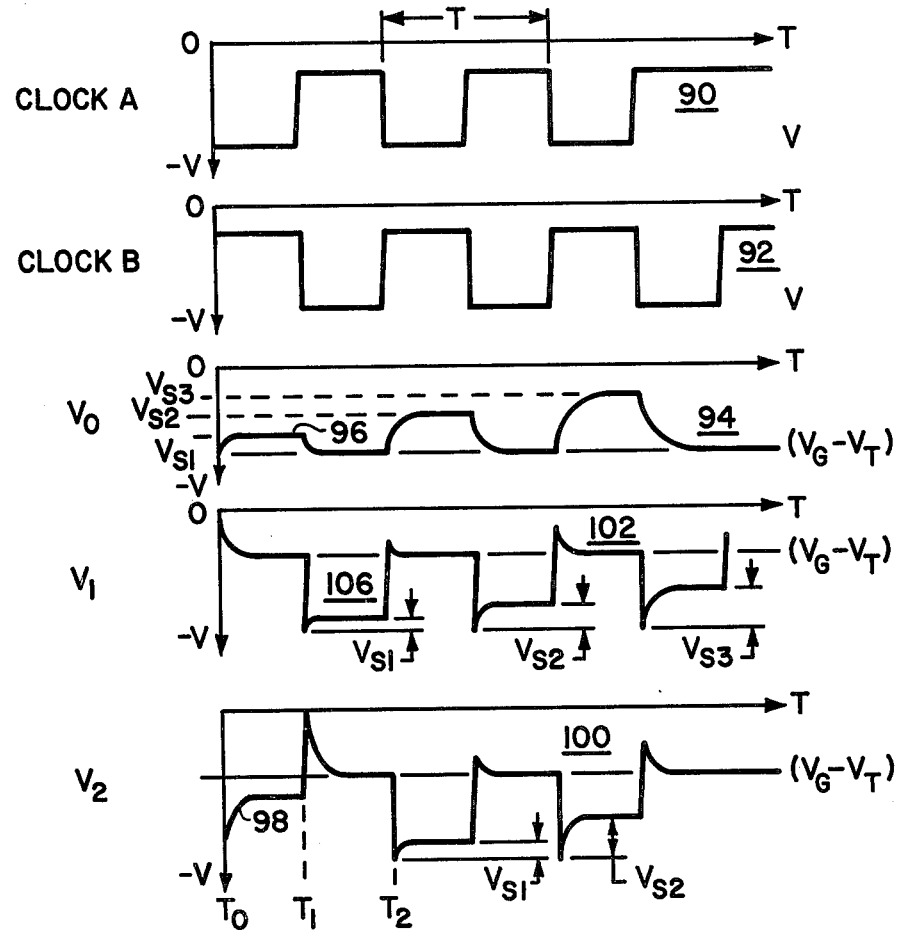
FIG. 7 shows waveforms useful for understanding the operation of the amplitude control circuit of FIG. 6.

To generate the desired amplitude programmability, delay line 26 may comprise bucket brigade circuit 86, as illustrated in FIG. 6, although any known type of analog delay line or shift register could be used. Bucket brigade 86 is a charge transfer device (CTD). Other types of tapped CTD's, such as a charge coupled device (CCD) could be used for providing amplitude programmability. Bucket brigade circuit 86 is shown as including (M) bucket brigade devices or stages, where for thirty one tapped outputs (31-bit detector array) M = 62. Alternate bucket brigade stages are tapped to drive gates of load devices 61 and 64 of each associated ROM cell 36. Bucket brigade circuit 86 is generally known in the art. Referring to FIG. 6, the operation of bucket brigade circuit 86 to provide amplitude weighted biasing voltages to respective ROM cells may be briefly explained. It is to be understood that each alternate tapped stage of bucket brigade circuit 86 may be directly connected to the gates of load devices 61 and 64, which operate as source followers, of each respective ROM cell or, as illustrated in FIG. 6, may be coupled through a source follower to these devices.

The appropriate pattern of sampled voltages can be clocked into bucket brigade circuit 86 at a rapid rate, for example, 1 megaHertz until the desired pattern appears at alternate tapped nodes. Hence, the period (T) of clocking signal A or clocking signal B (waveforms 90 and 92) is one microsecond. Waveform 94 illustrates the clocking of a DC signal into the bucket brigade which appears at node 0. As illustrated, at time $T_0$, clock signal A goes negative such that every one of the field effect transistors coupled thereto are rendered conductive. Simultaneously, clocking signal B goes positive to render the remaining field effect transistors nonconductive. Hence, a voltage which corresponds to portion 96 of waveform 94, applied at input terminal 80 is transferred to node 0 between time $T_0$ and $T_1$, when transistor $T_{IN}$ is rendered conductive. If it is assumed that prior to time $T_0$ that other input voltages have been clocked into bucket brigade circuit 86, then simultaneously with voltage 96 being clocked to node 0, transistor T2, which is simultaneously rendered conductive in response to clocking signal A, will be charged to an initial value representative of the magnitude of the clocking signal and then discharged to a value representative of the voltage which was stored at node 1 prior to time $T_0$ (portion 98 of waveform 100)). This voltage then appears at node 2. Therefore, the voltage across the capacitor at node 1 (waveform 102) is discharged at the same rate that the capacitor at node 2 is charged until the voltage supplied to transistor $T_2$ from node 1 can no longer support conduction thereof and the transistor is shut off. Next, in response to clocking signal B going negative, time $T_1$, transistor $T_1$ is rendered conductive for transferring the energy stored in capacitor Cin to node 1 as shown by portion 106 of waveform 102. Hence, at time $T_2$ node one is charged to a voltage value indicative of the voltage, $V_{s1}$. In a similar manner, at time $T_2$ when clocking signal A goes negative, the voltage $V_{s1}$ at node 1 is transferred to node 2 as transistor $T_2$ is rendered conductive. This cycle is repeated in response to the clocking signals until the desired patterns ($V_{s1}$, $V_{s2}$, $V_{s3}$ and etc.) are clocked to appropriate stages of bucket brigade circuit 86. At this time, the clocking signal voltages are maintained at their existing values, and, as previously discussed, an acoustic wave is excited which propagates through the matched filter array. The output of detector device cell 28, at terminal 22, will have an amplitude which is proportional to the value of DC drain current, $I_D$, which is flowing through the conductive detector device 30 or 32. The value of $I_D$ is related to Vo (which is derived from the respective tapped output from bucket brigade (86) referred to in equation (1) by the appropriate relationship;

$$I_D \simeq k (V_O - V_T)^2 \qquad (2)$$

where $k$ is related to the dimensions and physical parameters of the detector MOSFET structure.

Thus, what has been described above, is an amplitude and phased programmable matched filter device which is useful for providing channel smoothing or averaging functions to analog adaptive signal processors or spread spectrum receivers respectively. The taps of the matched filter array are both amplitude and phase weighted utilizing MOS technology.

Figure 8:
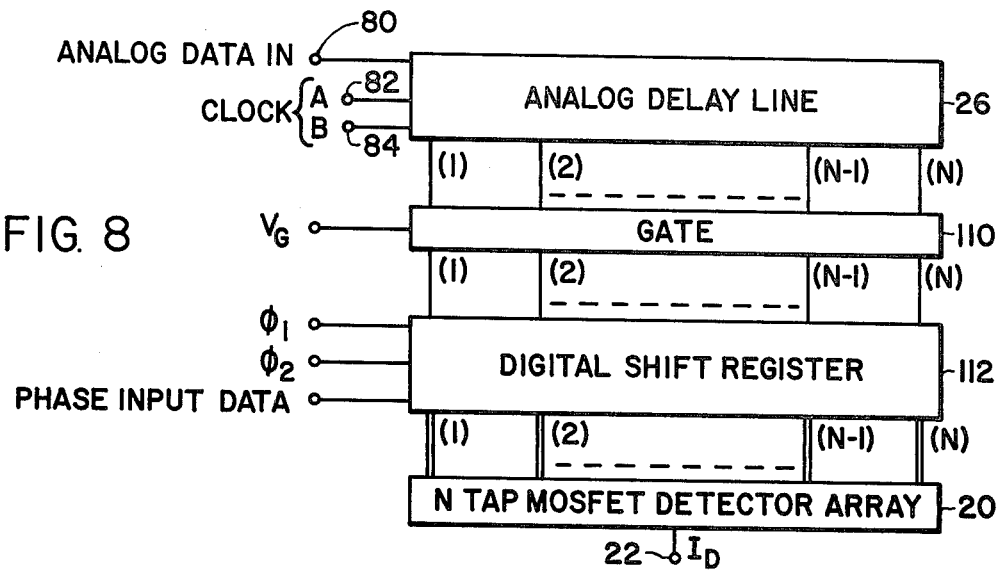
FIG. 8 is a block diagram of the matched filter of another embodiment.
Figure 9:
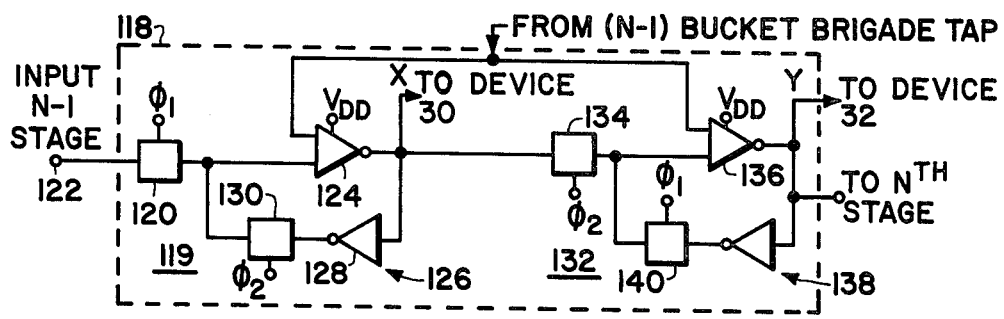
FIG. 9 is a block diagram of an individual shift register stage of the matched filter of FIG. 8.

Although the matched filter device has been described as including a bucket brigade circuit in conjunction with a ROM structure for providing amplitude and phase programmability, it is to be understood that ROM structure 24 could be replaced by a monolithic digital shift register, as illustrated by FIGS. 8 and 9, to provide a high degree of on chip programmability. The principles of operation would be similar to that as discussed above.

Referring to FIG. 8 there is illustrated matched filter 10 which includes buffer gate circuit 110 and digital shift register 112 in place of ROM array 24. In a preferred embodiment, analog delay line 26 would comprise bucket brigade device 86 and the amplitude coding data would be clocked to appropriate tapped outputs as previously described and illustrated in FIG. 10. The outputs from bucket brigade circuit, ($V_{BBN}$), having predetermined magnitudes, are applied to buffer gate circuit 110. If, for example, a 31-bit sequence is desired, 31 $V_{BBN}$ outputs are derived (N=31) from bucket brigade circuit 86.

Buffer gate circuit 110 may be provided to isolate the clocking of the amplitude data into bucket brigade circuit 86 from the clocking of phase coding data into digital shift register 112. The clocking of both the amplitude data into bucket brigade circuit 86 and phase coding data into shift register 112 may occur simultaneously and at the same rate although not necessarily. Buffer gate 110 comprises a plurality (N) of MOS-AND gates. Each AND gate has at least two input terminals, one being adapted to receive a gating voltage $V_G$, and the other receiving the appropriate output from bucket brigade 86. After the amplitude coding data and the phase coding data signals have been clocked to appropriate stages of bucket brigade 86 and shift register 112, respectively, the gating signal, $V_G$, is applied to transfer the outputs of bucket brigade 86 to the gates of appropriate load devices appropriate stages of shift register 112. The amplitude weighted outputs from shift register 112 would drive the gate electrodes of the selected detector device 30 or 32 so that a amplitude and phase, pseudo noise output is obtained at terminal 22 similar to that which has been described.

Referring to FIG. 9 there is illustrated individual stage 118 of shift register 112. Stage 118 comprises a plurality of MOSFET transmission gates and inverters known in the art which are coupled together in a "master" and "slave" configuration. Master portion 119 includes transmission gate 120 serially connected to inverter 124, and "refresh" circuit 126. Refresh circuit 126 includes inverter 128 in series with transmission gate 130 between inverter 124 and the output of transmission gate 120. An output signal from a previous stage is coupled to the input of transmission gate 120 at terminal 122 and is clocked through to the output of inverter 124 by clocking signal $\phi_1$. The output from inverter 124 is applied to the gate electrode of detector device 30, the input of "slave" portion 132 and to refresh circuit 126. "Slave" portion 132 is identical to master portion 119 and includes transmission gate 134 coupled to inverter 136 and refresh circuit 138 coupled in parallel between the input and output of inverter 136. The output from "slave" portion 132 (inverter 136) is coupled to the next shift register stage and to the gate electrode of detector device 32 which corresponds to the same stage.

Figure 10:
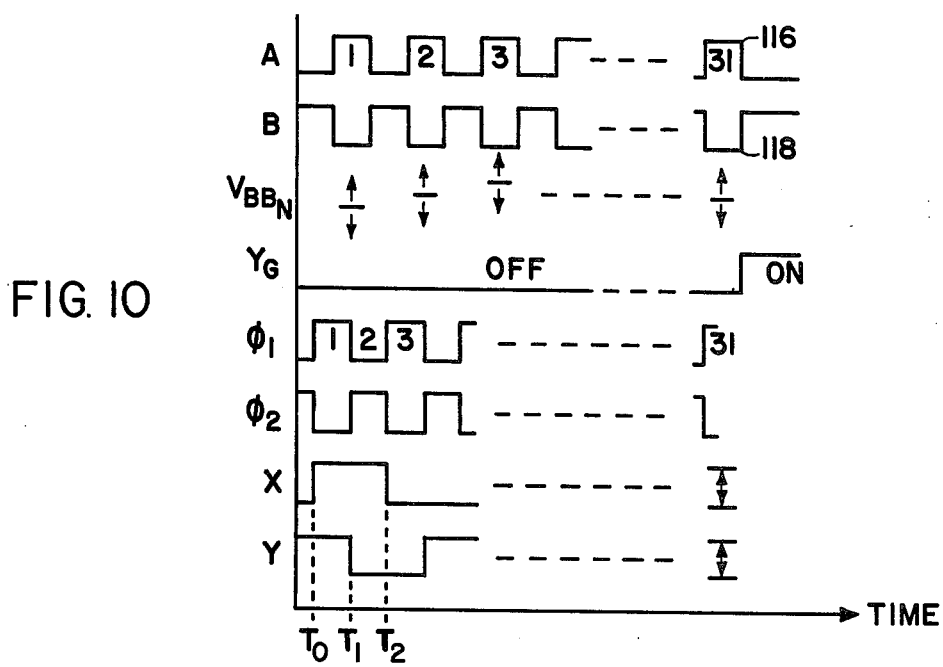
FIG. 10 is a timing diagram useful in understanding the operation of the filter of FIG. 8.

Referring to the timing diagram of FIG. 10, transmission gate 120 and 140 are rendered conductive by clocking signal, $\phi_1$, while the complement thereof, $\phi_2$, renders transmission gates 130 and 134 conductive. Moreover, the inverters of each stage may be identical to inverter 69 (FIG. 3) and are adapted to receive respective amplitude coding signals from bucket brigade 86 as coupled through buffer gate 110.

In operation a predetermined phase code is generated in timed relationship to the clocking signals $\phi_1$ and $\phi_2$ so that predetermined logic outputs are derived at the appropriate gates of devices 30 and 32 to render the selected device conductive as before. Concurrently, the amplitudes of the logic output signals are controlled by the magnitude of the amplitude coded signals applied to inverters 124 and 136 such that the output at terminal 22 is both amplitude and phase weighted as discussed previously.

When transmission gate 120 is clocked on by clock $\phi_1$, (time To) the phase data at terminal 122 is transferred to the input of inverter 124 and is inverted to appear at terminal X. At this time transmission gate 134 is clocked off such that the output which was present at terminal Y does not change states. This condition is ensured as transmission gate 140 of slave portion 132 is clocked on by clock $\phi_1$. Therefor the output at terminal Y is inverted and applied to the input of inverter 136 by refresh circuit 138. This signal is then again inverted to its original state. Thus, the output logic state at terminal Y does not change during the time interval T0-T1. At time T1, transmission gate 134 is clocked on by $\phi_2$ and the logic state that appears at terminal X is transmitted and inverted through inverter 136 to appear at terminal Y. Simultaneously, transmission gate 130 is clocked on and "refresh" circuit 126 maintains terminal X at the same logic state that was produced thereat prior to $T_1$. At time $T_2$, transmission gates 120 and 140 are again clocked as the above cycle is repeated. However, if the input signal to terminal 122 is at an opposite logic state, the output at terminal X will be caused to change with the output at terminal Y remaining constant. In this manner, the programmed phase code is clocked to the appropriate master and slave portion of each individual stage 118 of shift register 112. As disclosed above, the magnitude of the particular output logic state from the master and slave portion is amplitude weighted by the amplitude coded output signal from bucket brigade 86.

Although the above discussion is related to clocking appropriate data to tapped outputs of a charge transfer device (CTD), which are then applied through gating devices to a digital shift register, and concurrently clocking phase data thereinto so that appropriate phase and amplitude data is coupled to appropriate detector device gates, it should be understood that other methods may be preferred. Another method to achieve proper operation of the appropriate detector device, for example, is to operate the CTD and digital shift register independently and then combining the outputs of their corresponding output stages in any suitable MOSFET mixing circuitry to provide phase and amplitude data. This data would drive the gates of appropriate detector devices as before.

Thus what has been described is a matched acoustic wave filter having phase and amplitude programmability for generating pseudo noise waveforms.

What is claimed is:

1. An N tapped monolithic circuit acoustic wave filter having amplitude and phase programmability at each tapped output, including a transducer disposed on a surface of a semiconductor substrate for exciting traveling surface waves in response to applied electrical input signals, comprising in combination:
coding means having a first set of input terminals and being responsive to applied signals for deriving N-pair of predetermined bias coding signals said coding means also including a second set of N-input terminals;

a bucket brigade delay line for deriving N-output amplitude weighted signals at N-output terminals to cause the amplitudes of respective ones of said N-pair of coding signals to be varied accordingly, said N-output terminals being coupled to a respective N-input terminal of said coding means, said delay line having an input terminal adapted to receive N-bits of applied direct current (DC) voltages each bit corresponding to a respective N-output signal and first and second clock signal input terminals which are adapted to receive complementary clocking signals to clock said DC voltages respectively to an appropriate one of said N-output terminals, said delay line being integrated within the substrate;

N-pair of piezoresistive detector means integrated into the substrate within the path of the surface waves, each one of said pair of detector means being responsive to respective ones of said N-pair of amplitude varied coding signals for producing N output signals in timed sequence to the surface wave, each output signal having a predetermined phase and amplitude; and summing means coupled to each output of said N-pair of detector means.

2. An N-tapped monolithic circuit acoustic wave filter having amplitude and phase programmability at each tapped output, including a transducer disposed on a surface of a semiconductor substrate for exciting traveling surface waves in response to applied electrical input signals, comprising in combination:

coding means responsive to applied signals for deriving N-pair of predetermined bias coding signals, said coding including a read only memory (ROM) array having N-ROM cells, each of said N-ROM cell comprising a plurality of MOSFET driver devices, first and second MOSFET load devices, and a MOSFET inverter driver device, said first and second MOSFET load devices each having first, second and control electrodes, said first electrode of each load device being coupled to a power supply potential, said control electrode of each load device being commonly coupled to a respective input terminal of N-input terminals of said coding means, said second electrodes of each load device being a respective one of N-pairs of output terminals;

said MOSFET inverter driver device having first, second, and control electrodes, said first electrode being connected to said second electrode of said second MOSFET load device, said control electrode being coupled to said second electrode of said first MOSFET load device, said second electrode being connected to ground;

each one of said plurality of MOSFET driver devices having first, second, and control electrodes, said control electrodes being adapted to receive respective ones of said applied signals, said first electrodes being connected to said second electrode of said first MOSFET load device, said second electrodes being coupled to a ground reference terminal;

circuit means having N-output terminals each coupled to respective ones of said N-input terminals of said coding means, said circuit means being responsive to a predetermined set of input voltages for deriving N-output voltages of predetermined magnitudes so as to vary the amplitudes of said N-pair of coding signals;

N-pair of piezoresistive detector means integrated into the substrate within the path of the surface waves, each pair of detector means being responsive to respective ones of said N-pair of amplitude varied coding signals from said coding means for producing N-output signals in timed sequence to the surface wave, each output signal having a predetermined phase and amplitude; and summing means coupled to each output of said N-pair of detector means.

3. The filter of claim 2 wherein each of said N-pair of piezoresistive detector means are spaced a predetermined electrical wavelength from one another.

4. The filter of claim 3 wherein each pair of piezoresistive detector means includes:

a first MOSFET device having first, second and control electrodes, said first electrode being coupled to a ground reference potential, said second electrode being connected to said output terminal, said control electrode being coupled to a first one of a respective N-pair of output terminals of said coding means; and a second MOSFET device spaced a predetermined electrical wavelength from said first MOSFET device and having first, second and control electrodes, said control electrode being coupled to a second one of said respective N-pair of output terminals of said coding means, said first electrode being connected to said ground reference potential, said second electrode being connected to said output terminal.

5. The filter of claim 4 wherein said circuit means includes an analog delay line having an input terminal, N-output terminals and first and second clocking signal input terminals, said input terminal being adapted to receive N-bits of direct current (DC) voltages having predetermined amplitudes, said clocking input terminals being adapted to receive complementary clocking signals to clock said DC voltages to an appropriate one of said N-output terminals, said delay line being integrated the substrate.

6. The filter of claim 5 wherein said analog delay line includes a bucket brigade circuit comprising 2(N) stages having alternate stages thereof being tapped to provide said N output terminals.

7. The filter of claim 2 wherein:

said analog delay line includes a bucket brigade circuit having 2N stages of which alternate stages are tapped to provide said N-output terminals; and said coding means includes gating means having N-input terminals coupled to said N-output terminals of said analog delay line and N-output terminals coupled to respective input terminals of said digital shift register, said gating means being responsive to an applied gating signal for gating said N-output amplitude weighted signals from said analog delay line to said digital shift register.

8. The filter of claim 7 wherein each pair of said N-pair of piezoresistive detector means includes:

a first MOSFET device having first, second and control electrodes, said first electrode being coupled to ground reference said second electrode being connected to an output terminal to said summing means, said control electrode being coupled to a respective output of said N-pair of outputs from said coding means; and a second MOSFET device having first, second and control electrodes, said control electrode being coupled to the second output of said respective one of said N-pair of outputs from said coding means, said first electrode being coupled to said ground reference, said second electrode being connected to said output terminal.

9. An N-tapped monolithic circuit acoustic wave filter having amplitude and phase programmability at each tapped output, including a transducer disposed on a surface of a semiconductor substrate for exciting traveling surface waves in response to applied electrical input signals, comprising in combination:

an analog delay line responsive to applied analog input data for providing at N-output terminals, respectively, N amplitude weighted output signals, said analog delay line being integrated into the semiconductor substrate;

coding means including a digital shift register responsive to both said N amplitude weighted signals from said analog delay line and to applied phase input data for deriving N-pair of amplitude weighted coding signals at respective outputs, said digital shift register having N-individual stages with each stage having at least a pair of outputs corresponding to a respective pair of said N-pair outputs, said coding means being integrated into the semiconductor substrate;

N-pair of piezoresistive detector means which are integrated into the semiconductor substrate within the path of the traveling surface waves, each pair of detector means being responsive to respective ones of said N-pair of amplitude weighted coding signals for producing N-output signals in timed sequence to the traveling surface waves, each output signal having a predetermined phase and amplitude; and summing means coupled to each output of said N-pair of detector means.

* * * * *